(12) United States Patent
Miyagi et al.

(10) Patent No.: US 12,243,790 B2
(45) Date of Patent: Mar. 4, 2025

(54) SEMICONDUCTOR DEVICE AND INVERTER DEVICE

(71) Applicant: Mitsubishi Electric Corporation, Tokyo (JP)

(72) Inventors: Yosuke Miyagi, Fukuoka (JP); Hideki Tsukamoto, Fukuoka (JP); Takuro Mori, Fukuoka (JP); Masaru Furukawa, Fukuoka (JP); Korehide Okamoto, Fukuoka (JP); Takamasa Oda, Fukuoka (JP); Seiji Saiki, Fukuoka (JP); Takeshi Ogawa, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 392 days.

(21) Appl. No.: 17/658,995

(22) Filed: Apr. 12, 2022

(65) Prior Publication Data

US 2023/0010169 A1  Jan. 12, 2023

(30) Foreign Application Priority Data

Jul. 7, 2021  (JP) ................. 2021-113017

(51) Int. Cl.
*H01L 23/34* (2006.01)
*H01L 23/10* (2006.01)
*H01L 23/367* (2006.01)

(52) U.S. Cl.
CPC .......... *H01L 23/10* (2013.01); *H01L 23/3672* (2013.01)

(58) Field of Classification Search
CPC ........................ H01L 23/36; H01L 23/3672
(Continued)

(56) References Cited

U.S. PATENT DOCUMENTS 5,227,663 A * 7/1993 Patil ................ H05K 3/303
257/796
5,291,064 A * 3/1994 Kurokawa ............ H01L 23/473
257/E23.098

(Continued)

FOREIGN PATENT DOCUMENTS

JP  S59-177949 U  11/1984
JP  2012-015349 A  1/2012

(Continued)

OTHER PUBLICATIONS

An Office Action; "Notice of Reasons for Refusal," mailed by the Japanese Patent Office on Jun. 4, 2024, which corresponds to Japanese Patent Application No. 2021-113017 and is related to U.S. Appl. No. 17/658,995; with English language translation.

(Continued)

*Primary Examiner* — Nitin Parekh
(74) *Attorney, Agent, or Firm* — Studebaker & Brackett PC

(57) ABSTRACT

Provided are a semiconductor device and an inverter device with a decrease in yield being suppressed by preventing the adhesive from leaking into the inside of the semiconductor device. A heat sink, a wiring board provided on the heat sink, a semiconductor chip provided on the wiring board, a case housing provided on the heat sink so as to surround the wiring board and the semiconductor chip, an adhesive that adheres a lower surface joint portion of the case housing and an upper surface joint portion of the heat sink, a sealing material that fills the case housing and covers the wiring board and the semiconductor chip, and a convex portion provided on the lower surface joint portion of the case housing or the upper surface joint portion of the heat sink, that separates the adhesive from the sealing material are included.

13 Claims, 15 Drawing Sheets

(58) Field of Classification Search
USPC .................................. 257/706, 713, 717
See application file for complete search history.

(56) References Cited

U.S. PATENT DOCUMENTS

| | | | | |
|---|---|---|---|---|
| 5,532,513 | A * | 7/1996 | Smith | H01L 23/08 257/729 |
| 5,629,835 | A * | 5/1997 | Mahulikar | H01L 21/4828 174/257 |
| 6,011,304 | A * | 1/2000 | Mertol | H01L 23/04 257/710 |
| 11,676,883 | B2 * | 6/2023 | Shaikh | H01L 23/38 257/713 |
| 2003/0168749 | A1 * | 9/2003 | Koike | H01L 23/13 264/272.17 |
| 2010/0096747 | A1 * | 4/2010 | Kusano | H01L 23/49816 257/E23.101 |
| 2011/0316143 | A1 * | 12/2011 | Noritake | H01L 23/473 257/713 |
| 2011/0316147 | A1 * | 12/2011 | Shih | H01L 23/147 257/737 |
| 2012/0001309 | A1 | 1/2012 | Soyano | |
| 2015/0108631 | A1 * | 4/2015 | Hung | H01L 24/32 257/713 |
| 2015/0221625 | A1 * | 8/2015 | Chun | H01L 23/4334 257/707 |
| 2015/0255441 | A1 * | 9/2015 | Lamorey | H01L 25/50 438/107 |
| 2019/0206757 | A1 | 7/2019 | Hayashida et al. | |
| 2020/0219782 | A1 | 7/2020 | Hitomi | |

FOREIGN PATENT DOCUMENTS

| | | |
|---|---|---|
| WO | 2018/055667 A1 | 3/2018 |
| WO | 2019/049400 A1 | 3/2019 |

OTHER PUBLICATIONS

An Office Action; "Notice of Reasons for Refusal," mailed by the Japanese Patent Office on Oct. 15, 2024, which corresponds to Japanese Patent Application No. 2021-113017 and is related to U.S. Appl. No. 17/658,995; with English language translation.

* cited by examiner

F I G. 7
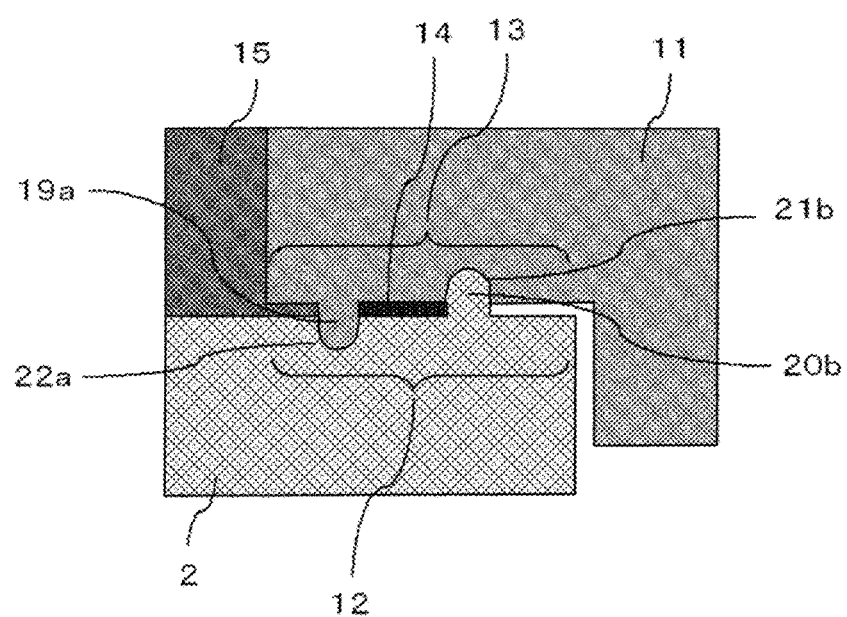

F I G. 8
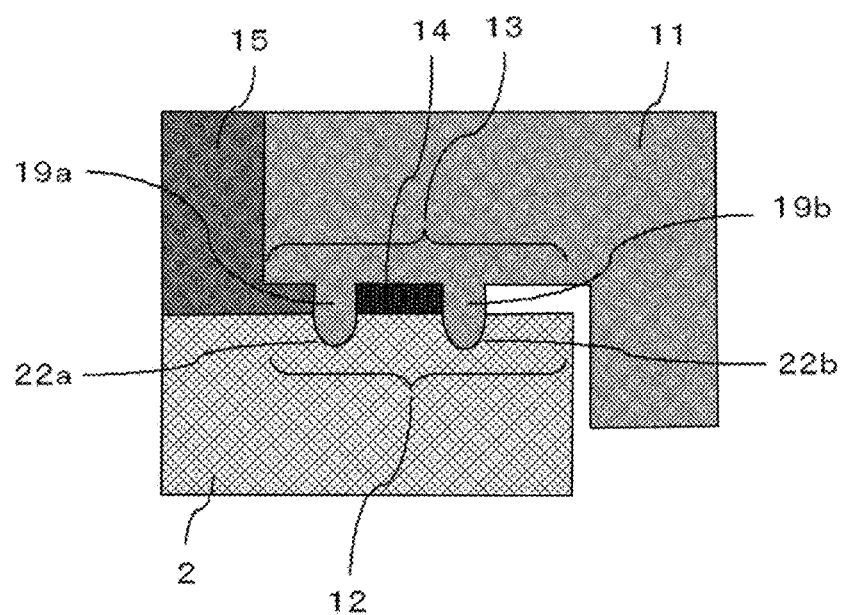

F I G. 1 3
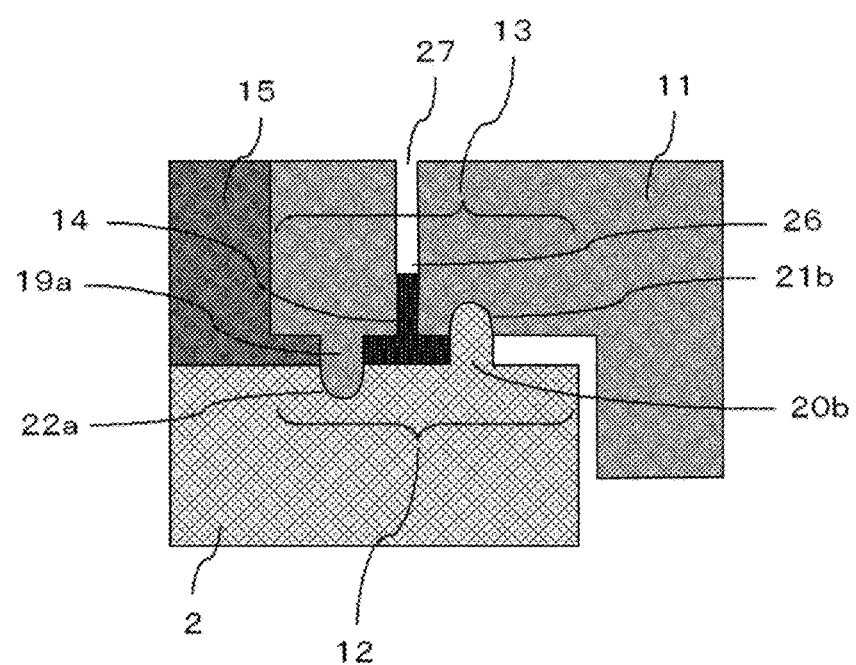

F I G. 1 4
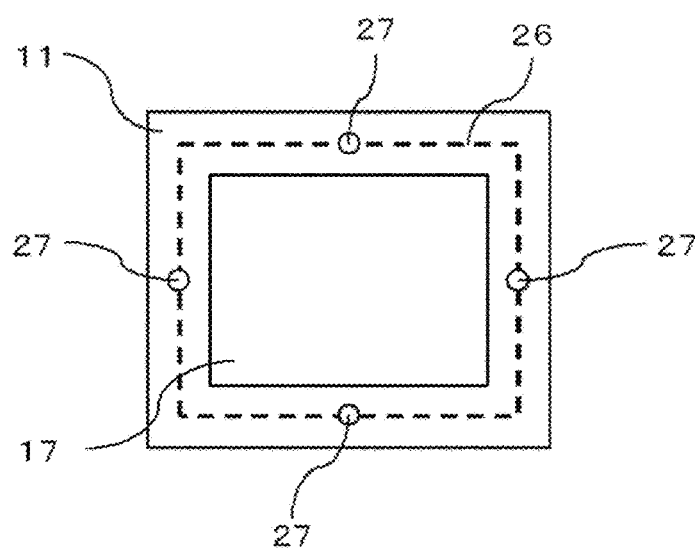

SEMICONDUCTOR DEVICE AND INVERTER DEVICE

BACKGROUND OF THE INVENTION

Field of the Invention

The present disclosure relates to a semiconductor device and an inverter device in which a case housing and a heat sink are adhered with an adhesive.

Description of the Background Art

In a semiconductor device of which case is filled with a sealing material, the case housing and the heat sink are adhered to each other by an adhesive. The adhesive also serves as a sealing material for preventing the intrusion of moisture and the like from the joint portion between the case housing and the heat sink. Therefore, as a conventional technique for securing the amount of the adhesive that serves as a sealing material, a structure in which a step portion is provided on at least one of the lower surface of the case housing and the outer peripheral portion of the upper surface of the heat sink has been disclosed (International Publication 2018/055667).

In the conventional technique, there has been a problem that the adhesive may leak into the semiconductor device, and the leaked adhesive may thermally expand to cause cracks in the insulating substrate, which may lead to a decrease in yield.

SUMMARY

An object is to obtain a semiconductor device and an inverter device with a decrease in yield being suppressed by preventing the adhesive from leaking into the inside of the semiconductor device.

The semiconductor device according to the present disclosure includes a heat sink, a wiring board, a semiconductor chip, a case housing, an adhesive, a sealing material, and a first convex portion. The wiring board is provided on the heat sink. The semiconductor chip is provided on the wiring board. The case housing is provided on the heat sink so as to surround the wiring board and the semiconductor chip 9. The adhesive adheres a lower surface joint portion of the case housing and an upper surface joint portion of the heat sink located at positions where the case housing and the heat sink are facing each other. The sealing material fills the case housing and covers the wiring board and the semiconductor chip. The first convex portion separates the adhesive and the sealing material in the lower surface boned portion of the case housing or the upper surface joint portion of the heat sink.

By providing the convex portion on the lower surface joint portion of the case housing or the upper surface joint portion of the heat radiating plate, suppression of the leakage of the adhesive into the inside of the semiconductor device is ensured. With this, the semiconductor device with a decrease in yield being suppressed can be easily manufactured.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 7 is an enlarged cross-sectional view of a joint portion between a heat sink and a case housing of a semiconductor device according to the third embodiment of the present disclosure;

FIG. 8 is an enlarged cross-sectional view of a joint portion between a heat sink and a case housing of a semiconductor device according to the fourth embodiment of the present disclosure;

FIG. 13 is an enlarged cross-sectional view of a joint portion between a heat sink and a case housing of a semiconductor device according to the ninth embodiment of the present disclosure;

FIG. 14 is a plan view illustrating the semiconductor device according to the ninth embodiment of the present disclosure.

DESCRIPTION OF THE PREFERRED EMBODIMENTS

Figure 1:
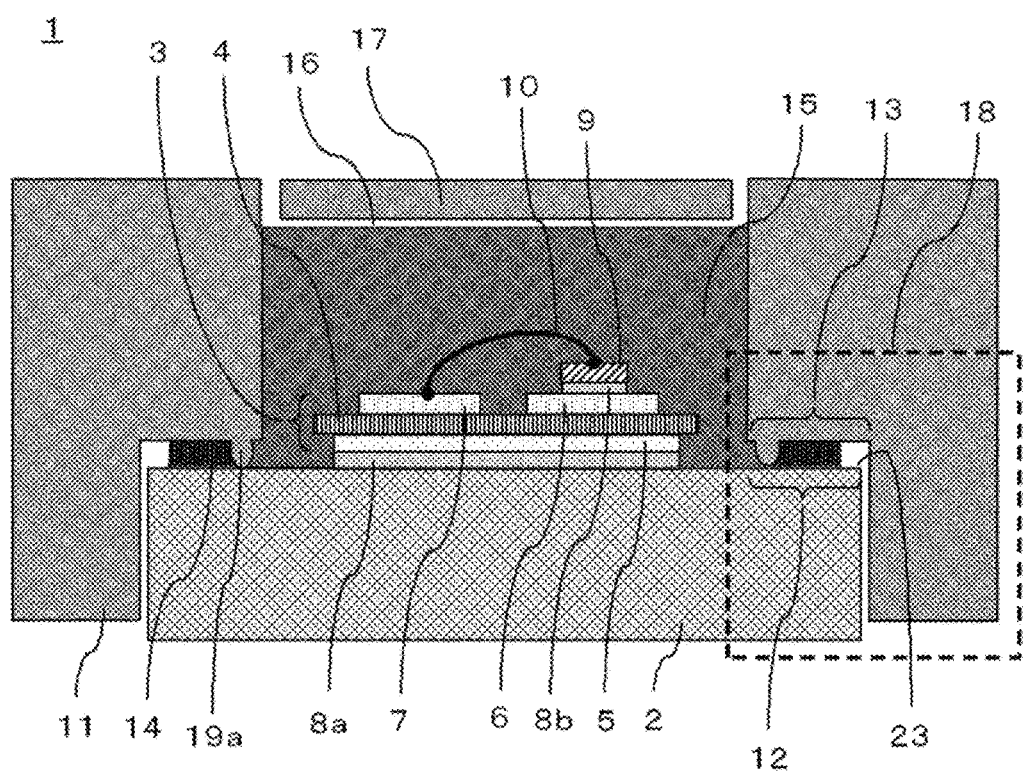
FIG. 1 is a cross-sectional view illustrating a semiconductor device according to the first embodiment of the present disclosure.

Hereinafter, semiconductor devices and an inverter device according to the embodiments of the present disclosure will be described with reference to the drawings. Components having the same or corresponding functions may be designated by the same reference numerals, and the description may be omitted.

First Embodiment

FIG. 1 is a cross-sectional view of a semiconductor device 1 according to the first embodiment. As illustrated in FIG. 1, a wiring board 3 is provided on a heat sink 2. The heat sink 2 is made of a metal such as Cu or Al, or a composite material such as AlSiC. The wiring board 3 is provided with a lower surface electrode 5 provided on the lower surface of the insulating substrate 4, and an upper electrode 6 and an upper electrode 7 provided on the upper surface of an insulating substrate 4. The material of the insulating layer 4 is, for example, ceramic. Further, the lower surface electrode 5 is joined to the heat sink 2 by solder 8a, and a semiconductor chip 9 joined by the solder 8b is provided on the upper surface electrode 6. The semiconductor chip 9 is, for example, an Insulated Gate Bipolar Transistor (IGBT), a Metal Oxide Semiconductor Field Effect Transistor (MOSFET) being a field effect transistor, or a diode. Further, the semiconductor chip 9 is connected to the upper electrode 7 by a wire 10. The case housing 11 is provided on the heat sink 2 so as to surround the wiring board 3 and the semiconductor chip 9. The case housing 11 is made of an engineering plastic such as Poly Phenylene Sulfide (PPS), Polybutylene Terephthalate (PBT) or Polyethylene Terephthalate+Polybutylene Terephthalate (PET+PBT). The upper surface joint portion 12 of the heat sink 2 is joined to the opposite lower surface joint portion 13 of the case housing 11 by an adhesive 14. The adhesive 14 is a silicone-based or epoxy-based material. Further, in order to ensure the insulating property, the sealing material 15 fills in the case housing 11 and covers the wiring board 3, the semiconductor chip 9, and the wire 10. The sealing material 15 is, for example, a silicone gel or an epoxy resin. An opening 16 of the case housing 11 is provided with a lid 17 to prevent foreign matter from entering. The lid 17 is made of an engineering plastic such as PPS, PBT or PET+PBT.

Figure 2:
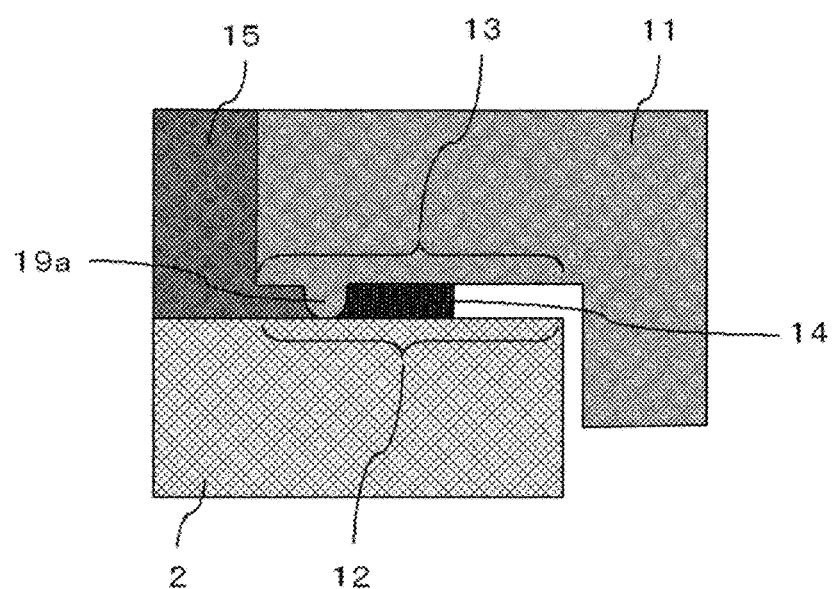
FIG. 2 is an enlarged cross-sectional view of a joint portion between a heat sink and a case housing of the semiconductor device according to the first embodiment of the present disclosure.

FIG. 2 is an enlarged view of a joint portion 18 between the heat sink 2 and the case housing 11 surrounded by the broken line in FIG. 1.

As illustrated in FIG. 2, in the heat sink 2 and the case housing 11, the upper surface joint portion 12 of the heat sink 2 and the lower surface joint portion 13 of the case housing 11 opposing to each other, are adhered to each other by the adhesive 14. The lower surface joint portion 13 of the case housing 11 is provided with a convex portion 19a (first convex portion) so as to surround the periphery of the wiring board 3. and the portion 19a is in contact with the upper surface joint portion 12 of the heat sink 2 so as to surround the wiring board 3 when the heat sink 2 and the case housing 11 are adhered to each other. Further, in the semiconductor device 1, assuming that the direction from a heat sink outer edge 23 toward the wiring board 3 is the inner direction and the direction from the wiring board 3 toward the heat sink outer edge 23 is the outer direction, the sealing material 15 fills inside the convex portion 19a, and the adhesive 14 is applied to the outside of the convex portion 19a, with the convex portion 19a serving as a boundary. It should be noted that, in FIG. 2, for the sake of simplicity, the convex portion 19a is illustrated as a protrusion having a cross-sectional shape of a steep rising edge, however, the shape thereof is not limited thereto, for example, the cross-sectional shape having a gradual rising edge, or a shape in which the contact surface with the upper joint portion 12 of the heat sink 2 is in contact with a wider flat surface may be adopted.

In the semiconductor device 1 configured in this manner, the adhesive 14 is applied to the outside of the convex portion 19a when the heat sink 2 and the case housing 11 are joined to each other. That is, the convex portion 19a is configured to separate the adhesive 14 and the sealing material 15, and the convex portion 19a serves as a barrier for the adhesive 14 to direct inward, and this prevents the adhesive 14 from leaking into the inside the convex portion 19a, in which the sealing material 15 is filled.

As described above, by providing the convex portion 19a on the lower surface joint portion 13 of the case housing 11, the leaking of the adhesive 14 inward is prevented. As a result, a problem caused by the adhesive 14 leaking inward is prevented; therefore, an effect of suppressing a decrease in yield due to the adhesive 14 leaking inward is obtained.

Second Embodiment

Figure 3:
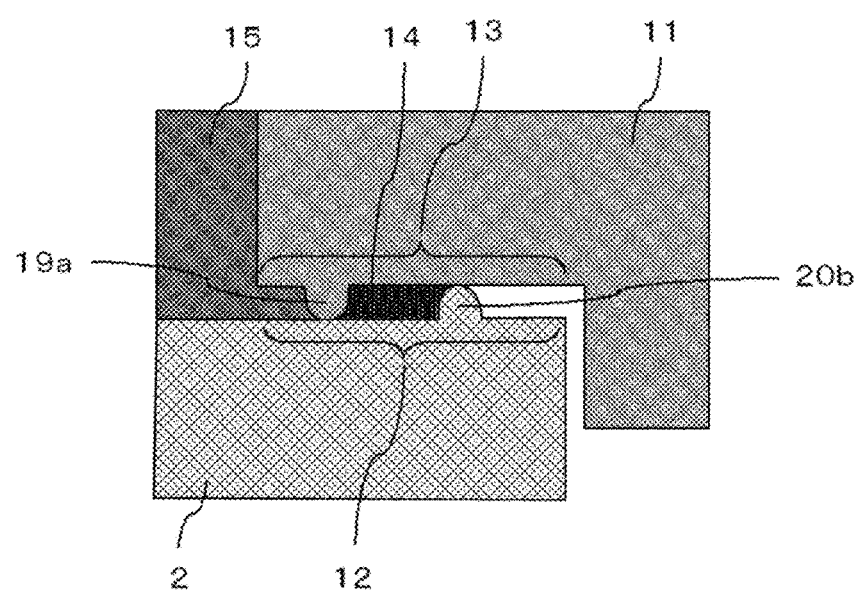
FIG. 3 is an enlarged cross-sectional view of a joint portion between a heat sink and a case housing of a semiconductor device according to the second embodiment of the present disclosure.

FIG. 3 is an enlarged cross-sectional view of a joint portion 18 according to the second embodiment. As illustrated in FIG. 3, the adhesive 14 is applied to the region surrounded by the convex portion 19a provided on the lower surface joint portion 13 of the case housing 11 and a convex portion 20b (second convex portion) provided on the upper surface joint portion 12 of the heat sink 2 and provided more outside than the convex portion 19a is.

In the semiconductor device configured in such a manner, by applying the adhesive 14 to the region surrounded by the convex portion 19a and the convex portion 20b when the heat sink 2 and the case housing 11 are joined, the heat sink 2 and the case housing 11 are joined, avoiding the adhesive 14 intruding into the inside of the semiconductor device, and the convex portion 19a serves as a barrier after the joining to prevent the adhesive 14 from leaking into the inside of the semiconductor device. Further, although in the first embodiment, a single convex portion 19a is provided, a plurality of convex portions 19a may be provided as illustrated in FIG. 3, and in such a case, the adhesive 14 can be held in the region surrounded by the convex portion 19a and the convex portion 20b.

Therefore, in addition to the same effect as that of the first embodiment, in the second embodiment, a sealing effect that prevents the intrusion of moisture or the like into the inside of the semiconductor device can be obtained due to the amount of the adhesive 14 being secured in the region surrounded by the convex portion 19a and the convex portion 20b.

First Modification of Second Embodiment

Figure 4:
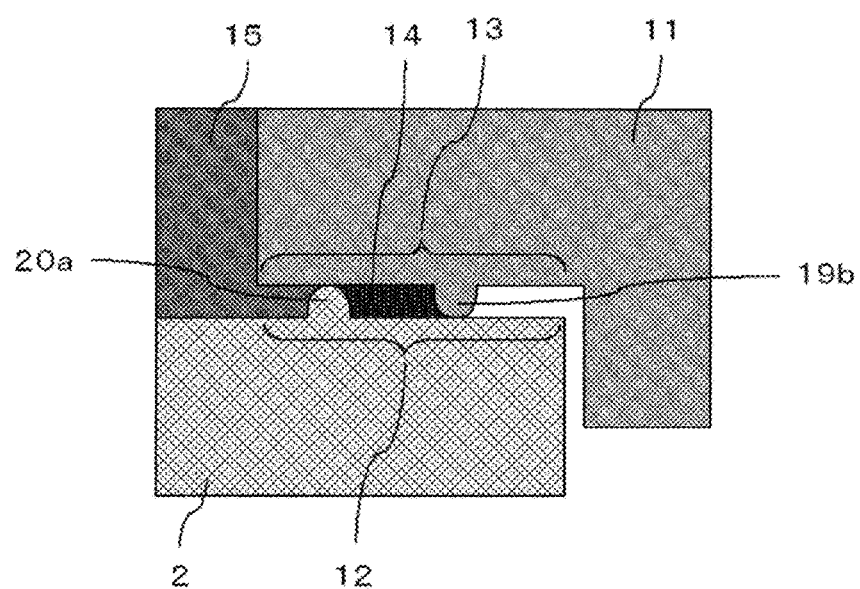
FIG. 4 is an enlarged cross-sectional view of a joint portion between a heat sink and a case housing of a semiconductor device according to the first modification of the second embodiment of the present disclosure.

FIG. 4 is an enlarged cross-sectional view of the joint portion 18 according to the first modification of the second embodiment. In the second embodiment, the convex portion 19a provided on the lower surface joint portion 13 of the case housing 11 is provided on the upper surface joint portion 12 of the heat sink 2 and the convex portion 20b provided on the upper surface joint portion 12 of the heat sink 2 is provided on the lower surface joint portion 13 of the case housing 11, meanwhile, in the first modification of the second embodiment, as illustrated in FIG. 4, the adhesive 14 is applied to a region surrounding by the convex portion 19b (second convex portion) provided on the lower surface joint portion 13 of the case housing 11 and the convex portion 20a (first convex portion) provided on the upper surface joint portion 12 of the heat sink 2 are formed.

In the semiconductor device configured in such a manner, by applying the adhesive 14 to the region surrounded by the convex portion 19b and the convex portion 20a when the heat sink 2 and the case housing 11 are joined, the heat sink 2 and the case housing 11 are joined, avoiding the adhesive 14 intruding into the inside of the semiconductor device, and the convex portion 20a serves as a barrier after the joining to prevent the adhesive 14 from leaking into the inside of the semiconductor device.

Further, as in the second embodiment, the adhesive 14 can be held in the region surrounded by the convex portion 19b and the convex portion 20a.

Therefore, the same effect as that of the second embodiment can be obtained.

Second Modification of Second Embodiment

Figure 5:
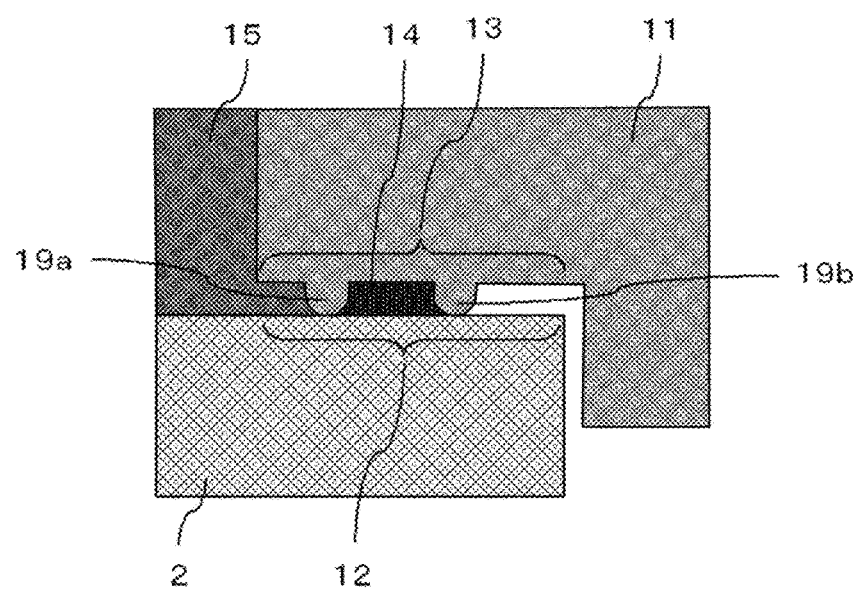
FIG. 5 is an enlarged cross-sectional view of a joint portion between a heat sink and a case housing of a semiconductor device according to the second modification of the second embodiment of the present disclosure.

FIG. 5 is an enlarged cross-sectional view of the joint portion 18 according to the second modification of the second embodiment. The second modification of the second embodiment adopts a configuration in which the two convex portions, the convex portion 19a and the convex portion 20b in the second embodiment, are provided on the lower surface joint portion 13 of the case housing 11, and as illustrated in FIG. 5, the adhesive 14 is applied to the region surrounded by the convex portion 19a (first convex portion) and the convex portion 19b (second convex portion) provided on the lower surface joint portion 13 of the case housing 11.

In the semiconductor device configured in such a manner, by applying the adhesive 14 to the region surrounded by the convex portion 19a and the convex portion 19b when the heat sink 2 and the case housing 11 are joined, the heat sink 2 and the case housing 11 are joined, avoiding the adhesive 14 intruding into the inside of the semiconductor device, and the convex portion 19a serves as a barrier after the joining to prevent the adhesive 14 from leaking into the inside of the semiconductor device. Further, as in the second embodiment, the adhesive 14 can be held in the region surrounded by the convex portion 19a and the convex portion 19b. Further, even the joined positions between the heat sink 2 and the case housing 11 should be misaligned, the distance between the convex portion 19a and the convex portion 19b does not change; therefore, the amount of adhesive can be secured regardless of the misalignment the positions between the heat sink 2 and the case housing 11.

Therefore, the same effect as that of the second embodiment can be obtained regardless of the misalignment of the joined positions between the heat sink 2 and the case housing 11.

Third Modification of Second Embodiment

Figure 6:
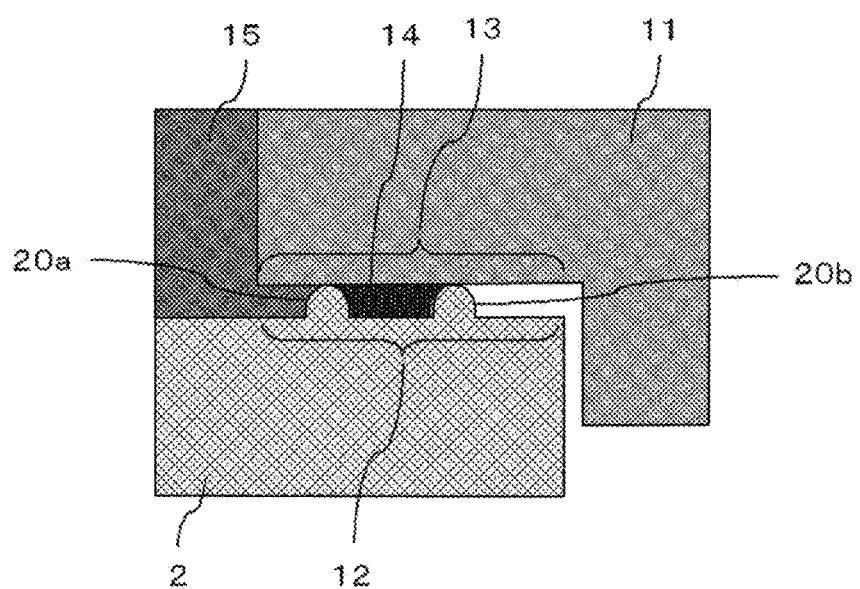
FIG. 6 is an enlarged cross-sectional view of a joint portion between a heat sink and a case housing of a semiconductor device according to the third modification of the second embodiment of the present disclosure.

FIG. 6 is an enlarged cross-sectional view of the joint portion 18 according to the third modification of the second embodiment. The third modification of the second embodiment adopts a configuration in which the two convex portions, the convex portion 19a and the convex portion 20b in the second embodiment, are provided on the upper surface joint portion 12 of the heat sink 2, and as illustrated in FIG. 6, the adhesive 14 is applied to the region surrounded by the convex portion 20a (first convex portion) and the convex portion 20b (second convex portion) provided on the upper surface joint portion 12 of the heat sink 2.

In the semiconductor device configured in such a manner, by applying the adhesive 14 to the region surrounded by the convex portion 20a and the convex portion 20b when the heat sink 2 and the case housing 11 are joined, the heat sink 2 and the case housing 11 are joined, avoiding the adhesive 14 intruding into the inside of the semiconductor device, and the convex portion 20a serves as a barrier after the joining to prevent the adhesive 14 from leaking into the inside of the semiconductor device. Further, as in the second embodiment, the adhesive 14 can be held in the region surrounded by the convex portion 20a and the convex portion 20b. Further, even the joined positions between the heat sink 2 and the case housing 11 should be misaligned, the distance between the convex portion 20a and the convex portion 20b does not change; therefore, the amount of adhesive can be secured regardless of the misalignment the positions between the heat sink 2 and the case housing 11.

Therefore, the same effect as that of the second embodiment can be obtained regardless of the misalignment of the joined positions between the heat sink 2 and the case housing 11.

Third Embodiment

FIG. 7 is an enlarged cross-sectional view of a joint portion 18 according to the third embodiment. The third embodiment adopts a configuration in which concave portions are provided at the respective positions facing the two convex portions of the convex portion 19a and the convex portion 20b in the second embodiment, and as illustrated in FIG. 7, the lower surface joint portion 13 of the case housing 11 is provided with the convex portion 19a and a concave portion 21b and the upper surface joint portion 12 of the heat sink 2 is provided with the convex portion 20b and a concave portion 22a. The convex portion 19a, the concave portion 21b, the convex portion 20b, and the concave portion 22a are provided at positions where the convex portion 19a (first convex portion) and the concave portion 22a (first concave portion) are fitted with each other and the convex portion 20b (second convex portion) and the concave portion 21b (second concave portion) are fitted with each other when the heat sink 2 and the case housing 11 are joined to each other. Further, the adhesive 14 is applied to the region surrounded by the convex portion 19a and the convex portion 20b.

In the semiconductor device configured in such a manner, by applying the adhesive 14 to the region surrounded by the convex portion 19a and the convex portion 20b when the heat sink 2 and the case housing 11 are joined, the heat sink 2 and the case housing 11 are joined, avoiding the adhesive 14 intruding into the inside of the semiconductor device, and the convex portion 19a serves as a barrier after the joining to prevent the adhesive 14 from leaking into the inside of the semiconductor device. Further, as in the second embodiment, the adhesive 14 can be held in the region surrounded by the convex portion 19a and the convex portion 20b. Further, the convex portion 19a and the concave portion 22a are fitted with each other and the convex portion 20b and the concave portion 21b are fitted with each other, therefore, misalignment of the heat sink 2 and the case housing 11 when joined is prevented.

Therefore, in addition to the same effect as that of the second embodiment is obtained, in the third embodiment, the effect of suppressing the decrease in yield due to the misalignment can be obtained because the misalignment when the heat sink 2 and the case housing 11 are joined is prevented.

Fourth Embodiment

FIG. 8 is an enlarged cross-sectional view of a joint portion 18 according to the fourth embodiment. The fourth embodiment adopts a configuration in which the difference between the depth of the concave portion and the height of the convex portion to be fitted in the third embodiment is made larger, and as illustrated in FIG. 8, the lower surface joint portion 13 of the case housing 11 is provided with the convex portion 19a and the convex portion 19b, and the upper surface joint portion 12 of the heat sink 2 is provided with the concave portion 22a (first concave portion) and a concave portion 22b (second concave portion). The convex portion 19a, the convex portion 19b, the concave portion 22a, and the concave portion 22b are provided at positions where the convex portion 19a and the concave portion 22a are fitted with each other and the convex portion 19b and the concave portion 22b are fitted with each other when the heat sink 2 and the case housing 11 are joined to each other, and the depth of the concave portion 22a is shallow with respect to the height of the convex portion 19a, and the depth of the concave portion 22b is shallow with respect to the height of the convex portion 19b. Further, the adhesive 14 is applied to the region surrounded by the convex portion 19a and the convex portion 19b.

In the semiconductor device configured in such a manner, by applying the adhesive 14 to the region surrounded by the convex portion 19a and the convex portion 19b when the heat sink 2 and the case housing 11 are joined, the heat sink 2 and the case housing 11 are joined, avoiding the adhesive 14 intruding into the inside of the semiconductor device, and the convex portion 19a serves as a barrier after the joining to prevent the adhesive 14 from leaking into the inside of the semiconductor device. Further, the depth of the concave portion 22a and the concave portion 22b is formed to be shallow with respect to the height of the convex portion 19a and the convex portion 19b; therefore, the region surrounded by the convex portion 19a and the convex portion 19b can hold more adhesive 14 than the region in the third embodiment can. Further, the convex portion 19a and the concave portion 22a are fitted with each other and the convex portion 19b and the concave portion 22b are fitted with each other; therefore, misalignment of the heat sink 2 and the case housing 11 when joined is prevented.

Therefore, in addition to the same effect as that of the third embodiment, in the fourth embodiment, a sealing effect that prevents the intrusion of moisture or the like into the inside of the semiconductor device can be obtained due to the amount of the adhesive 14 being secured in the region surrounded by the convex portion 19a and the convex portion 19b.

Fifth Embodiment

Figure 9:
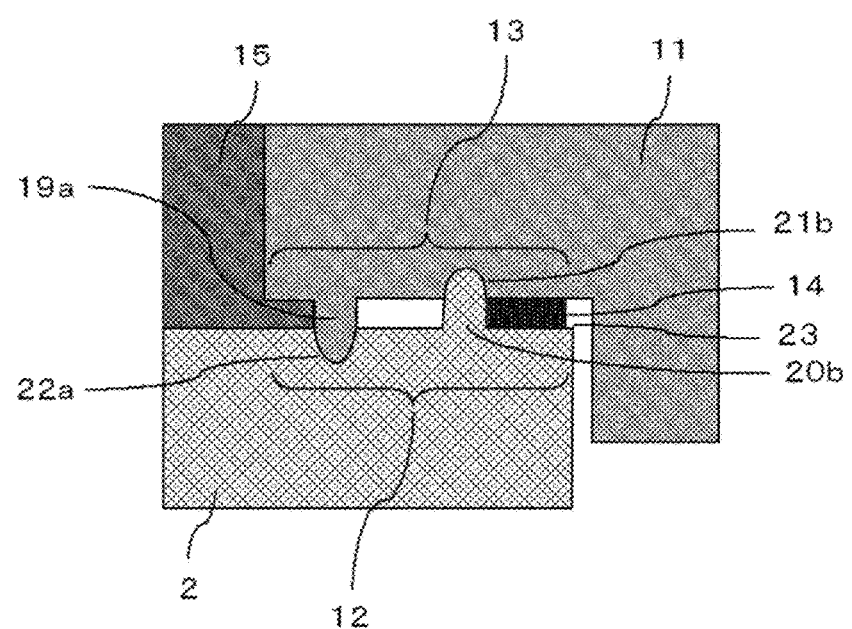
FIG. 9 is an enlarged cross-sectional view of a joint portion between a heat sink and a case housing of a semiconductor device according to the fifth embodiment of the present disclosure.

FIG. 9 is an enlarged cross-sectional view of a joint portion 18 according to the fifth embodiment. The fifth embodiment adopts a configuration in which the adhesive 14 is applied to the region between the convex portion 19b and the heat sink outer edge 23 in the fourth embodiment, and as illustrated in FIG. 9, the lower surface joint portion 13 of the case housing 11 is provided with the convex portion 19a and a concave portion 21b and the upper surface joint portion 12 of the heat sink 2 is provided with the convex portion 20b and a concave portion 22a. The convex portion 19a, the concave portion 21b, the convex portion 20b, and the concave portion 22a are provided at positions where the convex portion 19a and the concave portion 22a are fitted with each other and the convex portion 20b and the concave portion 21b are fitted with each other when the heat sink 2 and the case housing 11 are joined to each other, and the depth of the concave portion 22a is shallow with respect to the height of the convex portion 19a, and the depth of the concave portion 21b is shallow with respect to the height of the convex portion 20b. Further, the adhesive 14 is not applied to the region surrounded by the convex portion 19a and the convex portion 20b, and the adhesive 14 is applied to the region between the convex portion 20b of the upper surface joint portion 12 of the heat sink 2 and the heat sink outer edge 23.

In the semiconductor device configured in such a manner, by applying the adhesive 14 to the region between the convex portion 20b and the heat sink outer edge 23 when the heat sink 2 and the case housing 11 are joined, the heat sink 2 and the case housing 11 are joined, avoiding the adhesive 14 intruding into the inside of the semiconductor device, and the convex portion 19a and the convex portion 20b serve as barriers after the joining to prevent the adhesive 14 from leaking into the inside of the semiconductor device. Further, the depth of the concave portion 22a and the concave portion 22b is formed to be shallow with respect to the height of the convex portion 19a and the convex portion 20b; therefore, the region between the convex portion 20b and the heat sink outer edge 23 can hold adhesive 14. Further, the convex portion 19a and the concave portion 22a are fitted with each other and the convex portion 20b and the concave portion 21b are fitted with each other; therefore, misalignment of the heat sink 2 and the case housing 11 when joined is prevented.

Further, even if the adhesive 14 leaks from the gap between the convex portion 20b and the concave portion 21b due to processing variation during manufacturing, the leakage of the adhesive 14 can be stopped in the region surrounded by the convex portion 19a and the convex portion 20b; therefore, the adhesive 14 is prevented from leaking into the inside of the convex portion 19a in which the sealing material 15 is filled.

Therefore, in addition to the same effect as that of the fourth embodiment, in the fifth embodiment, the effect of suppressing the decrease in yield can be obtained without tightening of design tolerance.

Sixth Embodiment

Figure 10:
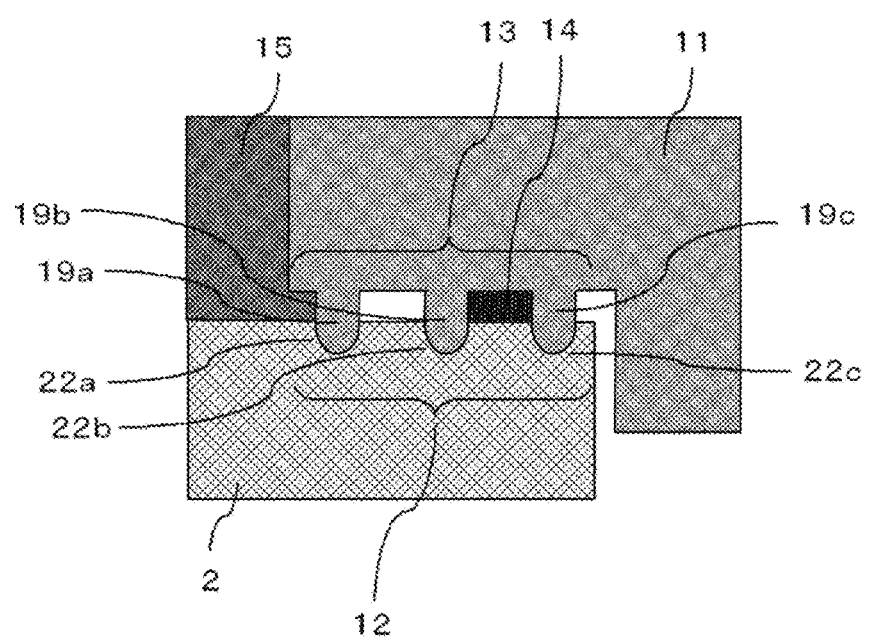
FIG. 10 is an enlarged cross-sectional view of a joint portion between a heat sink and a case housing of a semiconductor device according to the sixth embodiment of the present disclosure.

FIG. 6 is an enlarged cross-sectional view of a joint portion 18 according to the fifth embodiment. The sixth embodiment adopts a configuration in which three or more convex portions are provided and the adhesive 14 is not applied to the region adjacent to the region in which the sealing material 15 is filled as in the fifth embodiment, and as illustrated in FIG. 10, the lower surface joint portion 13 of the case housing 11 is provided with the convex portion 19a, the convex portion 19b, and a convex portion 19c (third convex portion), and the upper surface joint portion 12 of the heat sink 2 is provided with the concave portion 22a, the concave portion 22b, and a concave portion 22c (third concave portion). The convex portion 19a, the convex portion 19b, the convex portion 19c, the concave portion 22a, the concave portion 22b and the concave portion 22c are provided at positions where the convex portion 19a and the concave portion 22a are fitted with each other, the convex portion 19b and the concave portion 22b are fitted with each other, and the convex portion 19c and the concave portion 22c are fitted with each other when the heat sink 2 and the case housing 11 are joined to each other, and the depth of the concave portion 22a is shallow with respect to the height of the convex portion 19a, the depth of the concave portion 22b is shallow with respect to the height of the convex portion 19b, and the depth of the concave portion 22c is shallow with respect to the height of the convex portion 19c. Further, the adhesive 14 is applied to the region surrounded by the convex portion 19b and the convex portion 19c.

In the semiconductor device configured in such a manner, by applying the adhesive 14 to the region surrounded by the convex portion 19b and the convex portion 19c when the heat sink 2 and the case housing 11 are joined, the heat sink 2 and the case housing 11 are joined, avoiding the adhesive 14 intruding into the inside of the semiconductor device, and the convex portion 19a and the convex portion 19b serve as barriers after the joining to prevent the adhesive 14 from leaking into the inside of the convex portion 19a in which the sealing material 15 is filled. Further, the depth of the concave portion 22a, the concave portion 22b, and the concave portion 22c is formed to be shallow with respect to the height of the convex portion 19a, the convex portion 19b, and the convex portion 19c; therefore, the region surrounded by the convex portion 19b and the convex portion 19c can hold more adhesive 14 than the region in the third embodiment can. Further, the convex portion 19a and the concave portion 22a are fitted with each other, the convex portion 19b and the concave portion 22b are fitted with each other, and the convex portion 19c and the concave portion 22c are fitted with each other; therefore, misalignment of the heat sink 2 and the case housing 11 when joined is prevented.

Further, even if the adhesive 14 leaks from the gap between the convex portion 19b and the concave portion 22b due to processing variation during manufacturing, the leakage of the adhesive 14 can be stopped in the region surrounded by the convex portion 19a and the convex portion 19b; therefore, the adhesive 14 is prevented from leaking into the inside of the convex portion 19a in which the sealing material 15 is filled.

Therefore, the same effect as that of the fifth embodiment can be obtained.

Seventh Embodiment

Figure 11:
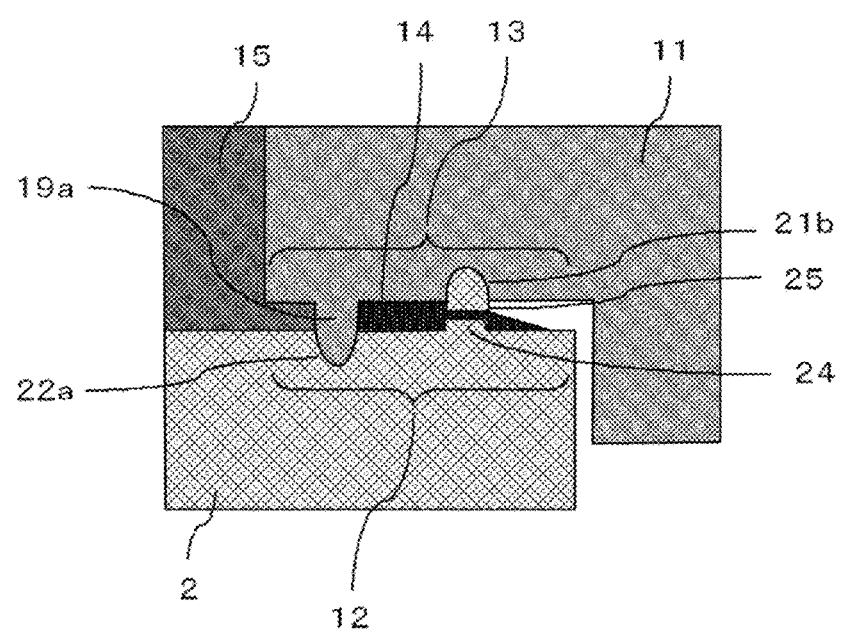
FIG. 11 is an enlarged cross-sectional view of a joint portion between a heat sink and a case housing of a semiconductor device according to the seventh embodiment of the present disclosure.

FIG. 11 is an enlarged cross-sectional view of a joint portion 18 according to the seventh embodiment. The seventh embodiment adopts a configuration in which a through hole 25 for allowing the adhesive 14 to escape to the outside is provided in a convex portion 24 when the amount of the applied adhesive 14 is large, and as illustrated in FIG. 11, the lower surface joint portion 13 of the case housing 11 is provided with the convex portion 19a and the concave portion 21b, and the upper surface joint portion 12 of the heat sink 2 is provided with the convex portion 24 having the concave portion 22a and the through hole 25. The convex portion 19a, the concave portion 21b, the convex portion 24, and the concave portion 22a are provided at positions where the convex portion 19a and the concave portion 22a are fitted with each other and the convex portion 24 and the concave portion 21b are fitted with each other when the case housing 11 and the heat sink 2 are joined to each other, and the depth of the concave portion 22a is shallow with respect to the height of the convex portion 19a, and the depth of the concave portion 21b is shallow with respect to the height of the convex portion 24. Further, the adhesive 14 is applied to the region surrounded by the convex portion 19a and the convex portion 24.

In the semiconductor device configured in such a manner, by applying the adhesive 14 to the region surrounded by the convex portion 19a and the convex portion 24 when the heat sink 2 and the case housing 11 are joined, the heat sink 2 and the case housing 11 are joined, avoiding the adhesive 14 intruding into the inside of the semiconductor device, and the convex portion 19a serves as a barrier after the joining to prevent the adhesive 14 from leaking into the inside of the semiconductor device. Further, the depth of the concave portion 22a and the concave portion 21b is formed to be shallow with respect to the height of the convex portion 19a and the convex portion 24; therefore, the region surrounded by the convex portion 19a and the convex portion 24 can hold the adhesive 14. Further, if the amount of the adhesive 14 applied to the region surrounded by the convex portion 19a and the convex portion 24 is large, the excess adhesive 14 is discharged to the outside through the through hole 25.

Further, the convex portion 19a and the concave portion 22a are fitted with each other and the convex portion 24 and the concave portion 21b are fitted with each other; therefore, misalignment of the heat sink 2 and the case housing 11 when joined is prevented.

Therefore, in addition to the same effect as that of the fourth embodiment, the effect of suppressing the decrease in yield due to the leakage of the adhesive 14 into the semiconductor device can be obtained, even if the large amount of adhesive 14 is applied.

Eighth Embodiment

Figure 12:
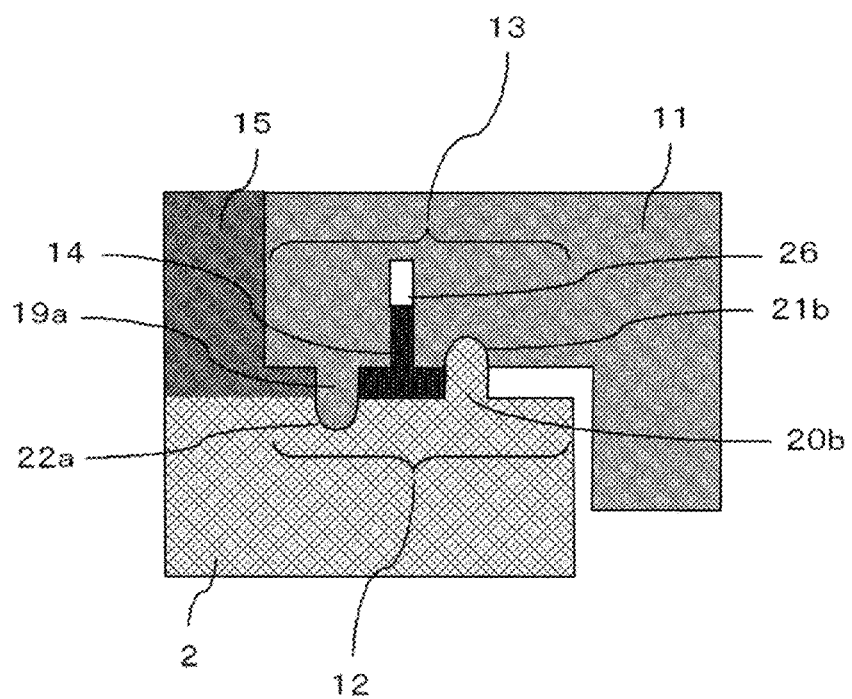
FIG. 12 is an enlarged cross-sectional view of a joint portion between a heat sink and a case housing of a semiconductor device according to the eighth embodiment of the present disclosure.

FIG. 12 is an enlarged cross-sectional view of a joint portion 18 according to the eighth embodiment. The eighth embodiment adopts a configuration in which a groove 26 for allowing the adhesive 14 to escape is provided in the case housing when the amount of the applied adhesive 14 is large, and as illustrated in FIG. 12, the lower surface joint portion 13 of the case housing 11 is provided with the convex portion 19a, the concave portion 21b, and the groove 26, and the upper surface joint portion 12 of the heat sink 2 is provided with the convex portion 20b and the concave portion 22a. The convex portion 19a, the concave portion 21b, the convex portion 20b, and the concave portion 22a are provided at positions where the convex portion 19a and the concave portion 22a are fitted with each other and the convex portion 20b and the concave portion 21b are fitted with each other when the heat sink 2 and the case housing 11 are joined to each other, and the depth of the concave portion 22a is shallow with respect to the height of the convex portion 19a, and the depth of the concave portion 21b is shallow with respect to the height of the convex portion 20b. The groove 26 is provided between the convex portion 19a and the concave portion 21b. Further, the adhesive 14 is applied to the region surrounded by the convex portion 19a and the convex portion 20b.

In the semiconductor device configured in such a manner, by applying the adhesive 14 to the region surrounded by the convex portion 19a and the convex portion 20b when the heat sink 2 and the case housing 11 are joined, the heat sink 2 and the case housing 11 are joined, avoiding the adhesive 14 intruding into the inside of the semiconductor device, and the convex portion 19a serves as a barrier after the joining to prevent the adhesive 14 from leaking into the inside of the semiconductor device. Further, the depth of the concave portion 22a and the concave portion 21b is formed to be shallow with respect to the height of the convex portion 19a and the convex portion 20b; therefore, the region surrounded by the convex portion 19a and the convex portion 20b can hold the adhesive 14. Further, if the amount of the adhesive 14 applied to the region surrounded by the convex portion 19a and the convex portion 20b is large, the excess adhesive 14 can escape to the groove 26.

Further, the convex portion 19a and the concave portion 22a are fitted with each other and the convex portion 20b and the concave portion 21b are fitted with each other, therefore, misalignment of the heat sink 2 and the case housing 11 when joined is prevented.

Therefore, the same effect as that of the seventh embodiment can be obtained.

Ninth Embodiment

FIG. 13 is an enlarged cross-sectional view of a joint portion 18 according to the ninth embodiment. The ninth embodiment adopts a configuration in which an air hole 27 directly connected to the groove 26 of the eighth embodiment is provided in the case housing 11, and the lower surface joint portion 13 of the case housing 11 is provided with the convex portion 19a, the concave portion 21b, and the groove 26 as illustrated in FIG. 13, the case housing 11 is further provided with the air hole 27 that is directly connected to the groove 26 and leads to the outside of the semiconductor device, and the upper surface joint portion 12 of the heat sink 2 is provided with the convex portion 20b and the concave portion 22a. The convex portion 19a, the concave portion 21b, the convex portion 20b, and the concave portion 22a are provided at positions where the convex portion 19a and the concave portion 22a are fitted with each other and the convex portion 20b and the concave portion 21b are fitted with each other when the heat sink 2 and the case housing 11 are joined to each other, and the depth of the concave portion 22a is shallow with respect to the height of the convex portion 19a, and the depth of the concave portion 21b is shallow with respect to the height of the convex portion 20b. The groove 26 is provided between the convex portion 19a and the concave portion 21b, and is directly connected to the air hole 27. The adhesive 14 is applied to the region surrounded by the convex portion 19a and the convex portion 20b.

FIG. 14 is a plan view in which the formation position of the groove 26 provided in the lower surface joint portion 13 of the case housing 11 when the semiconductor device is viewed from the direction from which the case housing 11 and the lid 17 covers is illustrated with a broken line and the positional relationship thereof with the air hole 27 provided in the case housing 11 is illustrated. As illustrated in FIG. 14, a plurality of air holes 27 directly connected to the groove 26 provided in the lower surface joint portion 13 of the case housing 11 are provided.

In the semiconductor device configured in such a manner, by applying the adhesive 14 to the region surrounded by the convex portion 19a and the convex portion 20b when the heat sink 2 and the case housing 11 are joined, the heat sink 2 and the case housing 11 are joined, avoiding the adhesive 14 intruding into the inside of the semiconductor device, and the convex portion 19a serves as a barrier after the joining to prevent the adhesive 14 from leaking into the inside of the semiconductor device. Further, the depth of the concave portion 22a and the concave portion 21b is formed to be shallow with respect to the height of the convex portion 19a and the convex portion 20b; therefore, the region surrounded by the convex portion 19a and the convex portion 20b can hold the adhesive 14. Further, if the amount of the adhesive 14 applied to the region surrounded by the convex portion 19a and the convex portion 20b is large, the excess adhesive 14 can escape to the groove 26 that is directly connected to the air holes 27.

Therefore, the air holes 27 secure escape routes for air; therefore, when the amount of the adhesive 14 applied to the region surrounded by the convex portion 19a and the convex portion 20b is large, the adhesive 14 can more reliably escape to the groove 26 than that of the seventh embodiment.

Tenth Embodiment

Figure 15:
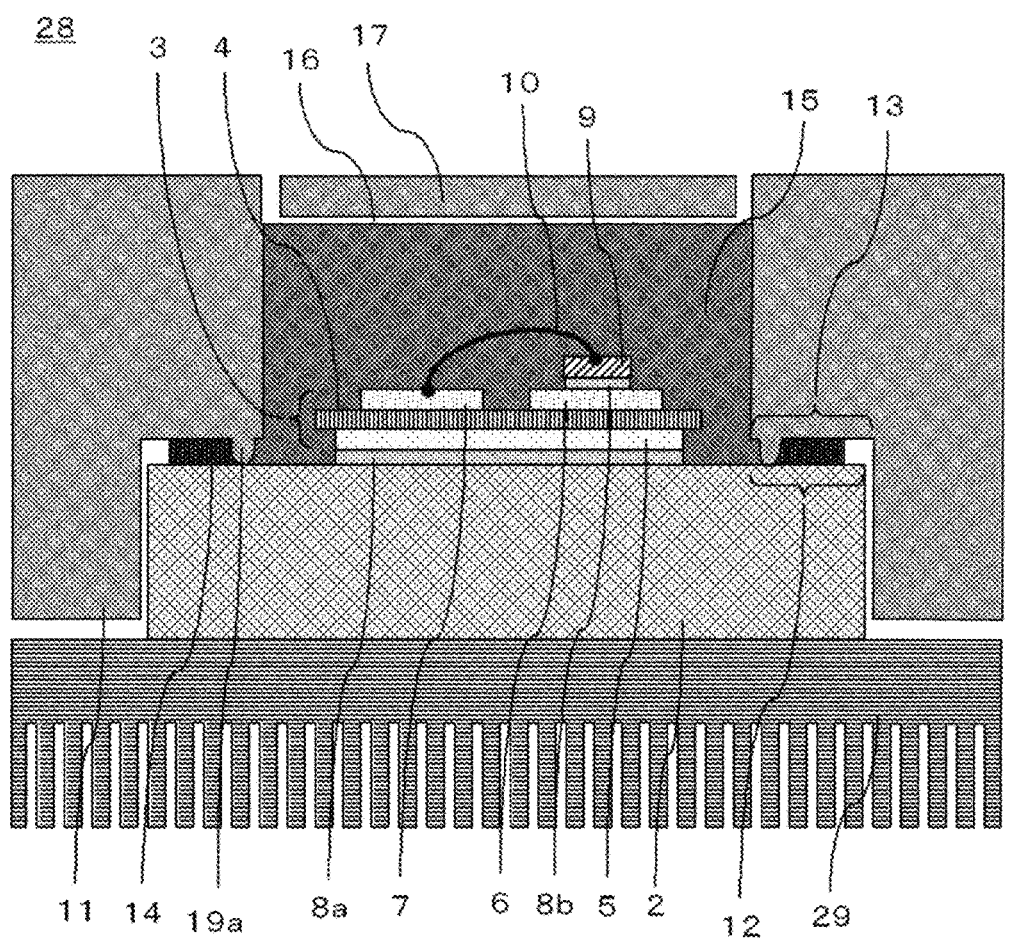
FIG. 15 is a cross-sectional view illustrating an inverter device according to the tenth embodiment of the present disclosure.

FIG. 15 is a cross-sectional view of an inverter device 28 according to the tenth embodiment. The inverter device 28 illustrated in FIG. 15 is an inverter device in which fins 29 are mounted on the heat sink 2 of the semiconductor device 1 illustrated in the first embodiment. Although FIG. 15 illustrates an inverter device using the semiconductor device illustrated in the first embodiment, an inverter device equipped with the semiconductor device illustrated in the first to ninth embodiments may be adopted.

In the inverter device configured as described above, an inverter device having the effect described in the first embodiment can be provided. The inverter devices having the effects shown in the first to the ninth embodiments can be provided by the inverter devices equipped with, not only the semiconductor device illustrated in the first embodiment but also by the semiconductor devices illustrated in the first to the ninth embodiments.

While the disclosure has been shown and described in detail, the foregoing description is in all aspects illustrative and not restrictive. It is therefore understood that numerous modifications and variations can be devised without departing from the scope of the disclosure.

What is claimed is:
1. A semiconductor device comprising:
a heat sink;
a wiring board contacting an upper surface of the heat sink;
a semiconductor chip contacting an upper surface of the wiring board;
a case housing provided on the heat sink so as to surround the wiring board and the semiconductor chip;
an adhesive that adheres a lower surface joint portion of the case housing and
an upper surface joint portion of the heat sink located at positions where the case housing and the heat sink are facing each other;
a sealing material that fills the case housing and covers the wiring board and the semiconductor chip;
a first convex portion provided on the lower surface joint portion of the case housing or the upper surface joint portion of the heat sink that separates the adhesive from the sealing material;
a second convex portion provided on the upper surface joint portion of the heat sink or the lower surface joint portion of the case housing and provided more outside than the first convex portion is;
a first concave portion provided on the upper surface joint portion of the heat sink or the lower surface joint portion of the case housing and fitted with the first convex portion; and
a second concave portion provided on the upper surface joint portion of the heat sink or the lower surface joint portion of the case housing and fitted with the second convex portion, wherein
the adhesive is applied in a region surrounded by the first convex portion and the second convex portion,
a depth of the first concave portion is shallow with respect to a height of the first convex portion, and
a depth of the second concave portion is shallow with respect to a height of the second convex portion.
2. The semiconductor device according to claim 1, wherein
a through hole through which the adhesive flows out from an inside of a semiconductor device toward an outside is provided in the second convex portion.
3. The semiconductor device according to claim 1, further comprising
a groove provided on the lower surface joint portion of the case housing and located between the first convex portion and the second convex portion.

4. The semiconductor device according to claim 1, further comprising
an air hole extending from the lower surface joint portion of the case housing through the case housing and located between the first convex portion and the second convex portion.

5. An inverter device comprising
the semiconductor device according to claim 1 and fins provided in the heat sink of the semiconductor device.

6. A semiconductor device comprising:
a heat sink;
a wiring board provided on the heat sink;
a semiconductor chip provided on the wiring board;
a case housing provided on the heat sink so as to surround the wiring board and the semiconductor chip;
an adhesive that adheres a lower surface joint portion of the case housing and an upper surface joint portion of the heat sink located at positions where the case housing and the heat sink are facing each other;
a first convex portion provided on the lower surface joint portion of the case housing or the upper surface joint portion of the heat sink;
a second convex portion provided on the upper surface joint portion of the heat sink or the lower surface joint portion of the case housing and provided more outside than the first convex portion is;
a first concave portion provided on the upper surface joint portion of the heat sink or the lower surface joint portion of the case housing and fitted with the first convex portion; and
a second concave portion provided on the upper surface joint portion of the heat sink or the lower surface joint portion of the case housing and fitted with the second convex portion, wherein a depth of the first concave portion is shallow with respect to a height of the first convex portion, a depth of the second concave portion is shallow with respect to a height of the second convex portion, and
the adhesive is applied outside the second convex portion.

7. The semiconductor device according to claim 6, further comprising:
a third convex portion provided on the upper surface joint portion of the heat sink or the lower surface joint portion of the case housing and provided more outside than the second convex portion is;
a third concave portion provided on the upper surface joint portion of the heat sink or the lower surface joint portion of the case housing, fitted with the third convex portion, and having a depth being shallow with respect to a height of the third convex portion, wherein
the adhesive is applied in a region surrounded by the second convex portion and the third convex portion.

8. An inverter device comprising
the semiconductor device according to claim 6 and fins provided in the heat sink of the semiconductor device.

9. A semiconductor device comprising:
a heat sink;
a wiring board provided on the heat sink;
a semiconductor chip provided on the wiring board;
a case housing provided on the heat sink so as to surround the wiring board and the semiconductor chip;
an adhesive that adheres a lower surface joint portion of the case housing and an upper surface joint portion of the heat sink located at positions where the case housing and the heat sink are facing each other;
a sealing material that fills the case housing and covers the wiring board and the semiconductor chip;
a first convex portion provided on the lower surface joint portion of the case housing or the upper surface joint portion of the heat sink that separates the adhesive from the sealing material; and
a second convex portion provided on the upper surface joint portion of the heat sink or the lower surface joint portion of the case housing and provided more outside than the first convex portion is, wherein
the adhesive is applied in a region surrounded by the first convex portion and the second convex portion.

10. The semiconductor device according to claim 9, further comprising:
a first concave portion provided on the upper surface joint portion of the heat sink or the lower surface joint portion of the case housing and fitted with the first convex portion; and
a second concave portion provided on the upper surface joint portion of the heat sink or the lower surface joint portion of the case housing and fitted with the second convex portion, wherein
a depth of the first concave portion is shallow with respect to a height of the first convex portion,
a depth of the second concave portion is shallow with respect to a height of the second convex portion, and
the adhesive is applied in the region surrounded by the first convex portion and the second convex portion.

11. The semiconductor device according to claim 10, wherein
a through hole through which the adhesive flows out from an inside of a semiconductor device toward an outside is provided in the second convex portion.

12. The semiconductor device according to claim 10, further comprising
a groove provided on the lower surface joint portion of the case housing and located between the first convex portion and the second convex portion.

13. The semiconductor device according to claim 10, further comprising
an air hole extending from the lower surface joint portion of the case housing through the case housing and located between the first convex portion and the second convex portion.

* * * * *